(12) United States Patent
Unru et al.

(10) Patent No.: US 10,148,225 B2
(45) Date of Patent: Dec. 4, 2018

(54) METHOD AND INVERTER FOR DETERMINING CAPACITANCE VALUES OF CAPACITANCES OF AN ENERGY SUPPLY SYSTEM

(71) Applicant: SMA Solar Technology AG, Niestetal (DE)

(72) Inventors: Alexander Unru, Niestetal (DE); Harald Drangmeister, Kassel (DE); Tobias Mueller, Staufenberg (DE); Pablo Correa Vasquez, Bad Neustadt an der Salle (DE)

(73) Assignee: SMA Solar Technology AG, Niestetal (DE)

( * ) Notice: Subject to any disclaimer, the term of this patent is extended or adjusted under 35 U.S.C. 154(b) by 256 days.

(21) Appl. No.: 15/154,136

(22) Filed: May 13, 2016

(65) Prior Publication Data

US 2016/0254783 A1   Sep. 1, 2016

Related U.S. Application Data

(63) Continuation of application No. PCT/EP2014/074528, filed on Nov. 13, 2014.

(30) Foreign Application Priority Data

Nov. 14, 2013   (DE) .................. 10 2013 112 538

(51) Int. Cl.
*H02S 50/10*   (2014.01)
*H02S 50/00*   (2014.01)
(Continued)

(52) U.S. Cl.
CPC ............ *H02S 50/00* (2013.01); *G01R 31/028* (2013.01); *G01R 31/42* (2013.01); *H02J 3/38* (2013.01); *H02M 7/48* (2013.01)

(58) Field of Classification Search
CPC ....................................................... H02S 50/10
See application file for complete search history.

(56) References Cited

U.S. PATENT DOCUMENTS 6,320,769 B2    11/2001   Kurokami et al.
2005/0169018 A1    8/2005   Hatai et al.
(Continued)

FOREIGN PATENT DOCUMENTS

JP    2002335632 A   *   11/2002   ............... H02J 3/38
JP    2002335632 A       11/2002
(Continued)

*Primary Examiner* — Clayton E Laballe
*Assistant Examiner* — Jas Sanghera
(74) *Attorney, Agent, or Firm* — Eschweiler & Potashnik, LLC

(57) ABSTRACT

A method for determining capacitance values of capacitances of a photovoltaic system including a multiphase inverter which includes an output current filter on an alternating current side thereof and is connected to a multiphase energy supply network via a switching element and is associated with at least one intermediate circuit capacitance on the direct current side thereof is provided. The method includes disconnecting the photovoltaic system from the energy supply network by opening the switching element; operating the inverter to set up an island network after the disconnecting, wherein an in-phase AC voltage is applied to at least two outputs of an inverter bridge of the multiphase inverter and a flow of current is produced between the at least one intermediate circuit capacitance and at least one filter capacitance of the output current filter; measuring currents (Ia, Ib, Ic) flowing at the outputs of the inverter bridge and at least one voltage present at one of the capacitances, and determining a capacitance value of at least one of the capacitances using the determined voltage and the measured currents (Ia, Ib, Ic).

15 Claims, 10 Drawing Sheets

(51) Int. Cl.
   *G01R 31/42* (2006.01)
   *G01R 31/02* (2006.01)
   *H02J 3/38* (2006.01)
   *H02M 7/48* (2007.01)

(56) References Cited

U.S. PATENT DOCUMENTS

| | | |
|---|---|---|
| 2010/0091532 A1 | 4/2010 | Fornage |
| 2010/0157634 A1* | 6/2010 | Yu .............................. H02J 3/38 363/98 |
| 2012/0281443 A1 | 11/2012 | Wolf et al. |
| 2013/0155729 A1 | 6/2013 | Lee |
| 2014/0029308 A1 | 1/2014 | Cojocaru et al. |
| 2014/0032145 A1 | 1/2014 | Yoo |

FOREIGN PATENT DOCUMENTS

| | | |
|---|---|---|
| JP | 2008043061 A | 2/2008 |
| WO | 0218962 A1 | 3/2002 |

* cited by examiner

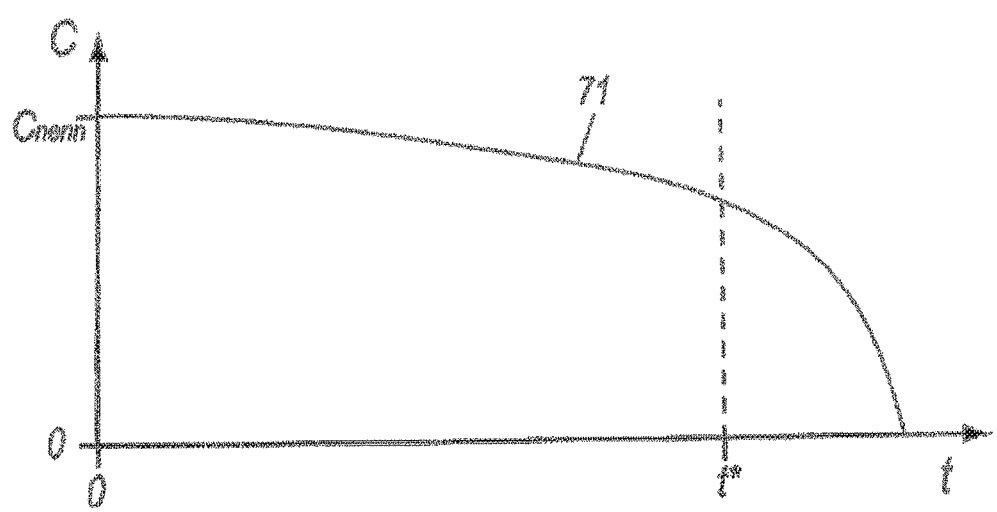

METHOD AND INVERTER FOR DETERMINING CAPACITANCE VALUES OF CAPACITANCES OF AN ENERGY SUPPLY SYSTEM

CROSS REFERENCE TO RELATED APPLICATIONS

This application claims priority to International Patent Application number PCT/EP2014/074528, filed on Nov. 13, 2014, which claims priority to German Patent Application number 10 2013 112 538.7, filed on Nov. 14, 2013, and is hereby incorporated by reference in its entirety.

FIELD

The disclosure relates to a method for determining capacitance values of capacitances of an energy supply system, for example a photovoltaic system, comprising a multiphase inverter which comprises an output current filter on the alternating current side and is connected to a multiphase energy supply network via a switching element and is associated with at least one intermediate circuit capacitance on the direct current side. The disclosure also relates to a multiphase inverter comprising a control device for carrying out such a method.

BACKGROUND

Inverters are used in energy generation systems, for example photovoltaic systems, called PV systems for short below, to convert a direct current into alternating current which can be fed in a single-phase or multiphase manner into a public or private energy supply network. In the case of a photovoltaic system, the direct current to be converted is provided by a photovoltaic generator (PV generator) which comprises any arrangement of a plurality of photovoltaic modules (PV modules) within the scope of the application. Alternatively and/or additionally, (possibly buffered) direct current can be provided from batteries or fuel cells or comparable chemically operating current sources.

Such energy supply systems have an arrangement of (buffer) capacitors in a DC intermediate circuit in order to smooth the DC voltage provided by the DC generator during conversion into alternating current. In the case of a single-stage inverter in which the voltage from the DC generator is immediately applied to the input side of an inverter bridge, such a capacitor arrangement is connected in parallel with the DC generator. In the case of a multistage inverter, at least one DC-DC converter is connected upstream of the inverter bridge and steps up or steps down the DC voltage provided by the DC generator to a voltage level suitable for operating the inverter bridge. In the case of such a system, the capacitor arrangement is usually arranged between the DC-DC converter and the inverter bridge. Within the scope of the application, the circuit in which the capacitor arrangement is arranged is referred to below in a generalized manner as the intermediate circuit, in a manner following the conventional terminology, independently of the position of the capacitor arrangement. Accordingly, the capacitor arrangement used to smooth the voltage is referred to as the intermediate circuit capacitor arrangement in both cases.

The inverter bridge of an inverter is usually fitted with power semiconductor switches which are operated in a clocked manner in a modulation method. A known and conventional modulation method is the pulse-width modulation method (PWM method) which is operated at a clock frequency, that is to say a number of switching cycles per second, in the kilohertz range. As a result, a clocked DC signal whose polarity changes is provided at the output of the inverter bridge, which DC signal is smoothed by an output current filter in such a manner that a voltage profile which is as sinusoidal as possible is produced at the output of the filter. For this reason, the output current filter is often also referred to as a sinusoidal filter.

In this case, the output current filter comprises a plurality of inductances and capacitances. A known output current filter which is frequently used has at least one inductance for each of the phases of the inverter, for example a coil which is arranged between the respective output of the inverter bridge and the corresponding phase connection of the energy supply network. Furthermore, a capacitance is respectively arranged between each output connection of the inverter bridge and a neutral conductor of the system at the inverter-side input of the filter. On the output side, i.e. toward the energy supply network, a second capacitance is provided for each phase. This second capacitance is connected in a star connection, i.e. it makes contact with a common floating voltage node. The first and second capacitances are usually formed by corresponding first and second capacitors.

The correct and reliable function of the inverter of the energy generation system is largely dependent on the capacitances mentioned, the intermediate circuit capacitance and the capacitances in the output current filter. However, the capacitors used to provide the capacitances are subject to ageing processes which reduce their capacitance value over time. In the case of electrolytic capacitors, a strong temperature dependence is additionally observed at temperatures below the freezing point. With knowledge of the changed capacitance values, the correct method of operation of the inverter can be corrected, up to a certain capacitance loss, by adjusting parameters of the inverter, for example regulating parameters which determine the switching times in the switching cycle of the power semiconductors of the inverter bridge. In the case of excessively large deviations of the capacitances, it is useful to terminate the operation of the inverter in order to avoid more far-reaching destruction of the inverter or the capacitors. Knowledge of the capacitance values of capacitances of the energy generation system, in particular of the intermediate circuit capacitances and the filter capacitances, is desirable both for adjusting the operating parameters of the inverter and for disconnecting the inverter or for outputting a warning indicating in advance problems which can possibly be expected.

In this respect, the document DE 10 2004 036 211 A1 discloses, for example, a method in which an intermediate circuit capacitor is pre-charged via a charging resistor during activation of the apparatus. The capacitance of the intermediate circuit capacitor can be determined during pre-charging from a measurement of the charging current and a measured voltage profile at the intermediate circuit capacitor. This method is suitable, in particular, when pre-charging of the intermediate circuit capacitor(s) is provided and the apparatus has a corresponding pre-charging apparatus.

In a similar manner, the intermediate circuit capacitor of an inverter in an engine controller is discharged by means of a discharging resistor during inactivity of the engine controller according to the document WO 02/18962 A1. The capacitance of the intermediate circuit capacitor is determined from a measured voltage profile during discharging.

The document US 2012/0281443 A1 discloses a method for determining a defective capacitor in an intermediate circuit consisting of a series circuit of a plurality of capacitors. In this case, the voltages dropping across the individual capacitors are measured and a defective capacitor is inferred from the level of the voltages. The document US 2013/0155729 A1 describes a method for predicting an expected service life of an intermediate circuit capacitor in a motor converter. In this method, an AC component flowing in the capacitor is determined and is used to determine a power deposited in the capacitor during operation. The deposited power is used to infer the ageing state and therefore the service life of the capacitor which can still be expected. However, capacitance values of the capacitors cannot be determined using the methods described in the two documents mentioned.

The document US 2009/0072982 A1 describes a system for energy conversion in which the temporal variation of the voltages across capacitors in the system is measured and the level of a voltage ripple at the capacitors is determined. In addition, the currents flowing during the occurrence of the voltage ripple are determined. The capacitance of the capacitor is determined from the level of the voltage ripple and the level of the flowing current. The document EP 2 690 452 A2 also describes a comparable method. These methods may be advantageous if it is desirable to determine the capacitances during normal operation of the energy supply system. However, for reasons of safety, it is often desirable to accordingly diagnose the correct functionality of the capacitors before an energy generation system is connected to the energy supply network. For example, it may be problematic to operate an energy supply system at high power if the capacitance of intermediate circuit capacitors has fallen to extremely low values owing to the temperature. This problem occurs, for example, in connection with electrolytic capacitors as intermediate circuit capacitors in ground-mounted PV systems under extreme weather conditions. Such a PV system is generally started only after the intermediate circuit capacitors have been heated by means of a heating apparatus provided for this purpose.

SUMMARY

The present disclosure is directed to a method for determining capacitances in an energy generation system, which method can be carried out without additional outlay on apparatus as far as possible before the energy generation system is coupled to an energy supply network and is in the feed mode. The disclosure is also directed to an inverter which is suitable for carrying out such a method.

A method according to the disclosure of the type mentioned at the outset comprises disconnecting the photovoltaic system from the energy supply network by opening the switching element. The inverter is operated to set up an island network, an in-phase AC voltage being applied to at least two outputs of an inverter bridge of the inverter and a flow of current being produced between the at least one intermediate circuit capacitance and at least one filter capacitance of the output current filter. Currents flowing at the outputs of the inverter bridge and at least one voltage present at one of the capacitances are measured and a capacitance value of at least one of the capacitances is then determined using the determined voltage and the measured currents.

The practice of setting up an island network, in which an AC voltage is applied to the output current filter by the inverter bridge, also generates a flow of current between the at least one intermediate circuit capacitance and the output current filter in the event of disconnection from the energy supply network. Capacitance values of capacitances of the PV system can then be determined using a current and voltage measurement. As a result of the fact that at least two phases are operated in phase, a greater flow of current and, on account of the resulting pulsating power consumption from the intermediate circuit capacitance, a greater ripple of the determined voltage are established than would be the case during normal operation in which all phases are phase-shifted with respect to one another. A higher measurement accuracy is therefore achieved.

In one advantageous configuration of the method, the voltage across at least one of the intermediate circuit capacitances of the PV system is measured. The capacitance value of the at least one intermediate circuit capacitance is determined from the level of a ripple in the voltage and the measured currents. In this configuration, it is possible to determine the capacitance values of the intermediate circuit capacitor(s) using the method according to the disclosure before the inverter is connected to the energy supply network.

In the case of a temporally varying flow of current into/out of the intermediate circuit, the level of the voltage across the at least one intermediate circuit capacitance varies at a frequency which is associated with the frequency of the current and—depending on the phase relationship at the outputs of the inverter bridge—is twice or three times the frequency of the current in the island network. The variation of the voltage across the at least one intermediate circuit capacitance is also referred to as voltage ripple within the scope of the application.

In another advantageous configuration of the method, the voltage across at least one first capacitance of the output current filter is determined, the capacitance value of the at least one first capacitance being determined from the determined voltage and the measured currents. It is therefore also possible to determine capacitance values of capacitors of the output current filter before the inverter is connected to the energy supply network. In this configuration, the method is suitable, in particular, for determining capacitance values of capacitors which are arranged between an output of the inverter bridge and a common neutral conductor.

Particularly high currents are achieved in the methods mentioned if an AC voltage is applied in phase to all outputs of the inverter bridge of the inverter. This results in the best possible accuracy when determining capacitance values.

In another advantageous configuration of the method, the voltage across at least one second capacitance of the output current filter is determined, the capacitance value of the at least one second capacitance being determined using at least two measurements of voltages and currents, the at least two measurements being carried out with different phase relationships of the AC voltages at the outputs of the inverter bridge. In this configuration, the method is suitable for also determining capacitance values of capacitors which are arranged inside the output current filter between different outputs of the inverter bridge. In this case, two measurements are carried out with different phase relationships at the outputs of the inverter bridge, by means of which the currents flowing through the second capacitances can be computationally separated from those currents which flow to a common neutral conductor via capacitances.

In the case of a three-phase inverter, in one embodiment an in-phase AC voltage is respectively applied to two outputs of the inverter bridge in each of the at least two measurements and an AC voltage which differs therefrom in terms of its phase angle is applied to a third output of the inverter bridge. The AC voltage applied to the third output in one embodiment has a phase angle of 180 degrees with respect to the AC voltage applied to the other two outputs of the inverter bridge. A maximum flow of current is therefore again achieved, which increases the accuracy when determining the capacitance values. Furthermore, in one embodiment three measurements are carried out, the AC voltage which differs in terms of its phase angle being applied to a different one of the outputs of the inverter bridge in each of the measurements. This makes it possible to determine the respective capacitance values on the basis of different measurements. The measurement results have a certain redundancy, as a result of which individual capacitance values are over-determined. The over-determined nature makes it possible to estimate the quality and therefore the significance of the measurement result.

In another advantageous configuration of the method, a determined capacitance value is compared with a predefined minimum capacitance value, a capacitance value below the minimum capacitance value being signaled. Furthermore, a determined capacitance value is advantageously stored and is compared with previously stored capacitance values. In one embodiment a rate of change of the capacitance value is preferably determined from the determined capacitance value and at least one stored capacitance value, a service life of the capacitor providing the capacitance being estimated using the rate of change. In these configurations of the method, the determination of the capacitance is advantageously used to warn a system operator of instantaneous or possibly imminent problems. Countermeasures can therefore be initiated immediately or as a precaution.

In another advantageous configuration, the method is carried out repeatedly during a starting process of the inverter. A possibly only temporary problem which is solved during the (or else by the) execution of the method can therefore be identified and the starting process can possibly be continued. In this case, provision may be made for the method to be carried out for the purpose of heating capacitors in the intermediate circuit if the determined intermediate circuit capacitance changes during the method. The flow of current caused in the method can therefore be used to heat the capacitors, thus making it possible to gently eliminate a temperature-related reduction in the capacitance on account of the relatively small current flowing.

In another advantageous configuration, the method is carried out for different frequencies of the AC voltage at the outputs of the inverter bridge. The measured values which are then available in a manner dependent on the frequency can be used to determine an inductance value of at least one inductance of the output current filter. The sizes of all components of a typical output current filter can therefore be determined.

A multiphase inverter according to the disclosure for connection to an energy supply network comprises a control device with an evaluation unit. It is characteritzed by the fact that the control device, in conjunction with the evaluation unit, is set up to carry out one of the methods described above. The advantages described in connection with the methods result.

BRIEF DESCRIPTION OF THE DRAWINGS

The disclosure is explained in more detail below using exemplary embodiments with the aid of figures, in which:

FIG. 4 shows a graph for illustrating a typical reduction in a capacitance during the service life of a capacitor;

FIGS. 6a-6d each show a schematic equivalent circuit diagram of a part of the PV system while carrying out the methods according to FIG. 4, and FIGS. 7a and 7b each show a graph of a time-dependent change in the capacitance of an intermediate circuit capacitor during a method which is continuously carried out according to FIG. 4a.

DETAILED DESCRIPTION

Figure 1:
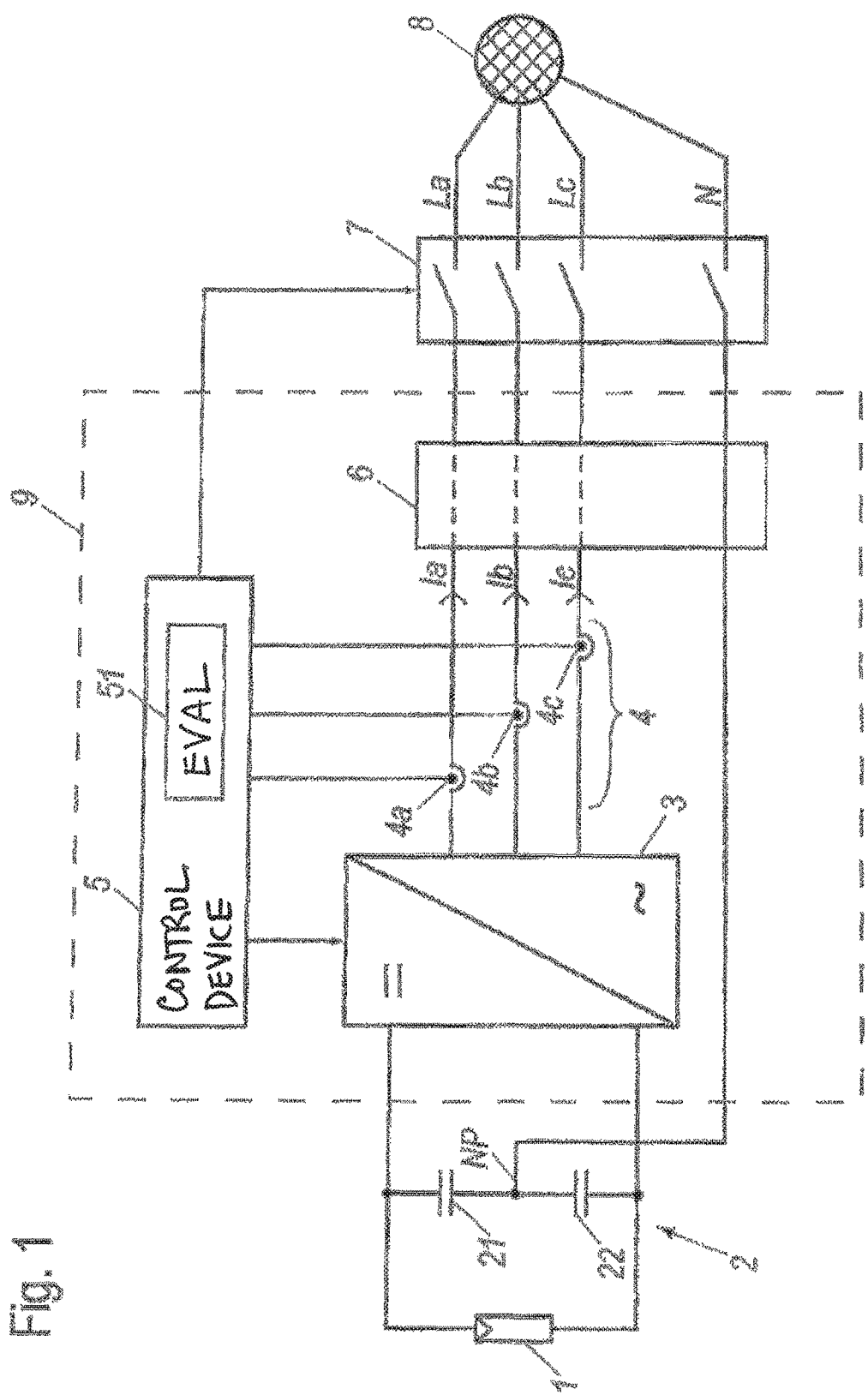
FIG. 1 shows a schematic block diagram of a PV system.

FIG. 1 shows a block diagram of an overview of the overall structure of a PV system. The PV system comprises a PV generator 1 which is symbolized by the circuit diagram of an individual PV cell in FIG. 1. The PV generator 1 may comprise one or more PV modules in a known manner. When a plurality of PV modules are used, they are often connected in series to form so-called strings. A plurality of these strings can be connected in parallel in order to form the PV generator 1.

The PV generator 1 is connected, via DC lines, to an intermediate circuit 2 which, in the example embodiment illustrated here, comprises two intermediate circuit capacitances 21, 22 connected in series. The center tap between the two intermediate circuit capacitances 21, 22 forms a virtual zero point NP which provides a reference potential for the direct current side of the PV system.

The PV generator 1 is connected, via the intermediate circuit 2, to an input of an inverter bridge 3 on the direct current side. The inverter bridge 3 is used to convert the direct current generated by the PV generator 1 into an alternating current which is output at outputs of the inverter bridge 3. The AC outputs of the inverter bridge 3 are connected to an output current filter 6, current measuring sensors 4 being arranged in the connection between the inverter bridge 3 and the output current filter 6.

The inverter bridge 3 is of multiphase design, here of three-phase design by way of example. In order to distinguish the three different phases, the notations "a", "b" and "c" are used below in conjunction with reference symbols or designations. Components which are assigned to the individual phases a, b, c are indicated by an added "a" or "b" or "c" in their reference symbols. If a reference symbol is used without such a notation, either all components are addressed with this reference symbol irrespective of their notation or a component of these components which is not specified any further is addressed with this reference symbol. A reference to the "current measuring sensor 4" therefore refers, depending on the context, either to the current measuring sensors 4a, 4b and 4c together or else to a current measuring sensor of the current measuring sensors 4a, 4b or 4c which is not specified any further.

The current measuring sensors 4 are used to determine currents Ia, Ib and Ic flowing at the respective output of the inverter bridge 3. The outputs from the current measuring sensors 4 are supplied to a control device 5 which comprises an evaluation unit (EVAL) 51 for measuring and evaluating the outputs from the current measuring sensors 4. The control device 5 also controls the inverter bridge 3, here in particular the semiconductor switches of the inverter bridge 3 which are not illustrated in any more detail in this figure.

The output current filter 6 is used for the signal shaping of the output signal from the inverter bridge 3. Without an output current filter, the output signal from the inverter bridge 3 is substantially a pulsating DC voltage signal changing between different potentials. The output current filter 6 uses this pulsed DC voltage signal to form an output current which is approximately in the form of an AC voltage and can be fed into an energy supply network 8 via an AC voltage (AC—alternating current) switching element 7. Like the inverter bridge 3, the energy supply network 8 is also of three-phase design with phase conductors La, Lb and Lc. There is also a neutral conductor N which is likewise connected to the virtual zero point NP of the direct current side of the PV system 1 via the AC switching element 7 and the output current filter 6. The output current filter 6 usually comprises an arrangement of a plurality of capacitances and inductances. A typical configuration of an output current filter 6 is described in more detail below in connection with FIGS. 2 and 3.

In the example embodiment illustrated, the inverter bridge 3, the current measuring sensors 4, the control device 5 and the output current filter 6 are integrated in an inverter 9. In alternative configurations, the intermediate circuit 2 may be additionally concomitantly integrated in the inverter 9, for example, or else the output current filter 6 may be arranged in a separate housing.

It is noted that only elements of the PV system which are essential within the scope of the application are illustrated in FIG. 1. For example, further switching elements (for example disconnecting elements, contactors), protective devices (for example fuses), monitoring devices and/or transformers which are not illustrated may be provided on the direct current side and/or alternating current side.

Figure 2A:
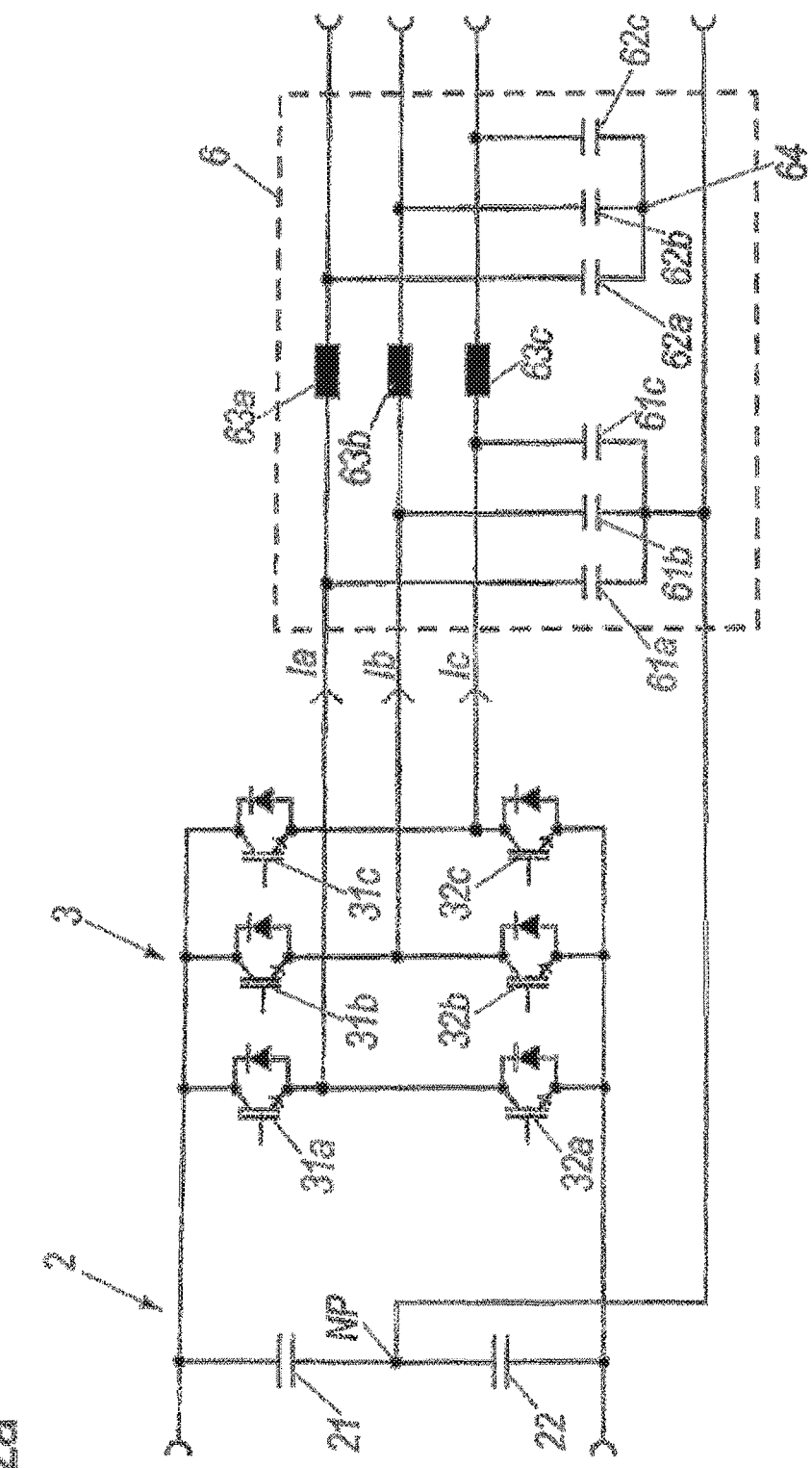
FIG. 2a shows a detailed illustration of a part of the PV system from FIG. 1.

FIG. 2a shows a section from FIG. 1 in more detail. FIG. 2a does not illustrate the PV generator 1, the control device 5, the AC switching element 7 and the energy supply network 8.

FIG. 2a indicates the structure of the inverter bridge 3 for the three phases a, b, c. For each of the three phases, the inverter bridge 3 has a bridge arm which, in the example illustrated here, comprises two semiconductor switches 31, 32. IGBT (insulated-gate bipolar transistor) switches are illustrated by way of example as semiconductor switches. It goes without saying that the inverter bridge 3 may likewise be constructed using other semiconductor power switches, for example MOSFETs (metal oxide semiconductor field-effect transistors). The semiconductor switches 31, 32 are associated with freewheeling diodes which are not mentioned in any more detail and may be external components or may be integrated in the semiconductor switches 31, 32. Components which are connected upstream of the semiconductor switches 31, 32 and are used to control the latter are not illustrated in FIG. 2a for reasons of clarity. The switching signals for the semiconductor switches 31, 32 are ultimately generated by the control device 5 according to known modulation methods, in particular pulse-width modulation methods (PWM), and are transmitted to the semiconductor switches 31, 32 via the corresponding control circuits.

FIG. 2a illustrates a two-point topology of the inverter bridge 3, in which each AC output of the inverter bridge 3, which is formed by the center tap between the semiconductor switches 31, 32 connected in series, can be connected either to a positive pole of the PV generator 1 or to a negative pole of the PV generator 1. It goes without saying that other topologies can be used, in particular a three-point topology in which it is additionally possible to connect the output connection of the inverter bridge 3 to the reference potential at the virtual zero point NP, that is to say the center tap between the intermediate circuit capacitances 21, 22, via a further semiconductor switch which operates in a bidirectional manner.

The output current filter 6 has two capacitances 61, 62 and an inductance 63 for each of the phases a, b, c. The capacitances 61, 62 are usually formed by capacitors, typically film capacitors. In this case, the first capacitance 61 is arranged between the output connection of the inverter bridge 3, which constitutes the input of the output current filter 6, and the neutral conductor N for each of the phases a, b, c. The inductance 63 is respectively arranged between input and output connections of the output current filter 6. The output connections of the output current filter 6 are each connected to a second capacitance 62, the respective other connections of the second capacitances 62 being connected to a common virtual neutral point 64. The output of the output current filter 6 is then connected to the energy supply network 8 via the AC switching element 7 in the manner shown in FIG. 1.

Figure 2B:
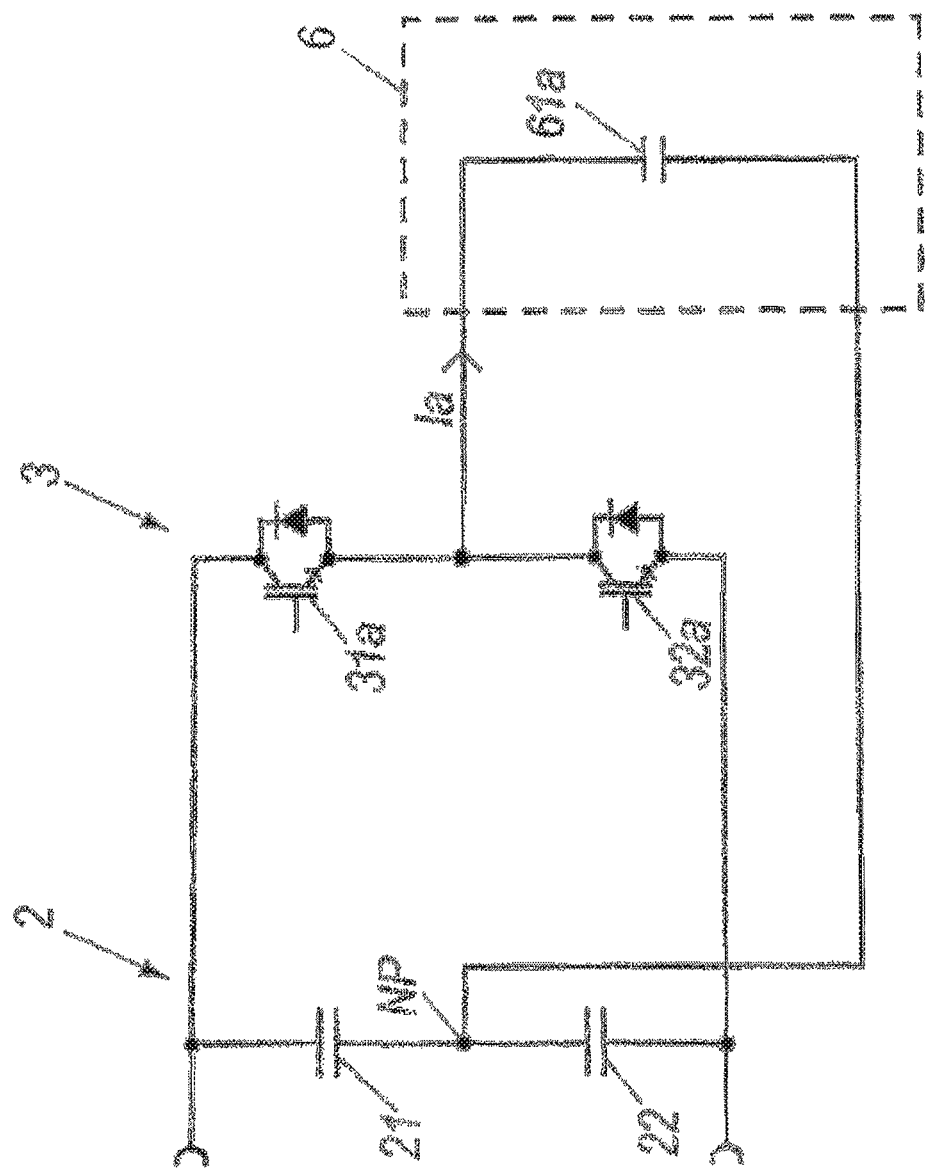
FIG. 2b shows a simplified illustration of FIG. 2a which is restricted to one phase.

For the sake of clarity for the further considerations, FIG. 2b represents FIG. 2a in a manner restricted to one of the phases, here the phase a by way of example. The output current filter 6 is illustrated in an equivalent circuit diagram which applies to an operating state in which the three phases a, b, c are operated in phase. On account of the in-phase nature of all phases a, b, c, no currents flow through the capacitances 62. Since the inverter 9 is disconnected from the energy supply network 8 by the open AC switching element 7, that is to say there is an island network situation, no currents flow through the inductances 63 either. In an equivalent circuit diagram of the output current filter 6, these components can therefore be ignored for said operating state of the inverter 9.

Methods according to the disclosure for determining capacitance values of the capacitances of the PV system are explained using FIGS. 3 to 5 described below. The methods can be carried out, for example, in the PV system illustrated in FIGS. 1 and 2 and, in particular, with the aid of the inverter used therein. The methods are therefore explained by way of example with reference to said figures and using the reference symbols used therein.

Figure 3:
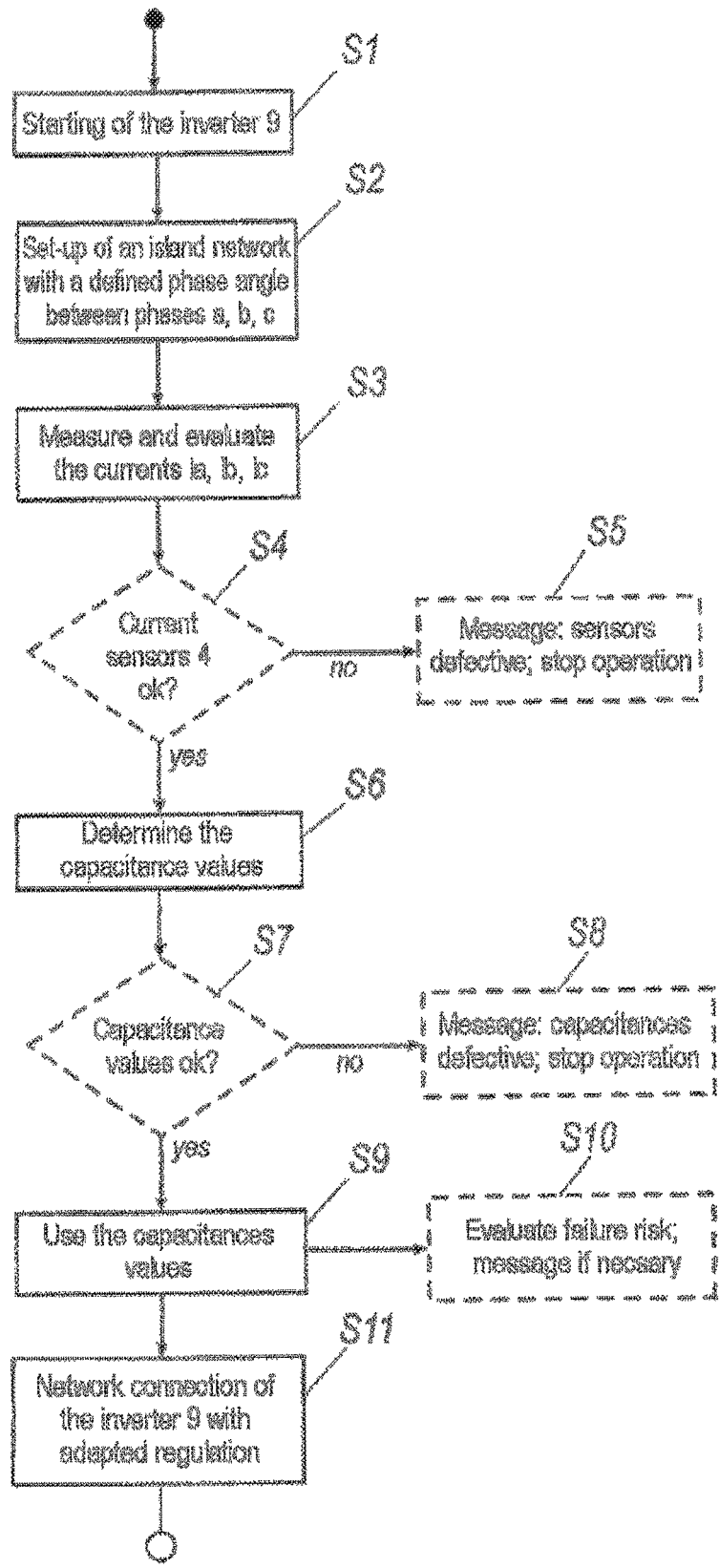
FIG. 3 shows a flowchart of a method according to the disclosure.

FIG. 3 shows a flowchart of a fundamental sequence of a method according to the application.

At S1, the inverter 9 of the PV system starts, for example after a period of time in which the PV generator 1 did not provide any sufficient power for operating the inverter and for feeding into the energy supply network 8, that is to say after a night for example. During the starting process of the inverter 9, the output of the inverter bridge 3 is disconnected from the energy supply network 8 by an open AC switching element 7. The inverter 9 is started as soon as a power sufficient for this purpose is provided by the PV generator 1.

At S2, a so-called island network is set up by the inverter 9 with the switching element 7 open. In a feed-in mode of the inverter 9, a phase shift of 120 degrees respectively prevails between the individual phases a, b, c in a three-phase network. The phase angle of the overall system is adapted to the phase angle prevailing in the energy supply network. At S2, a phase relationship between the phases a, b, c which differs therefrom is set up in the island network by virtue of at least two of the phases being in phase with one another (phase shift of 0 degrees). All three phases are in one embodiment operated in phase with a phase shift of 0 degrees with respect to one another. Such a situation in which all three phases a, b, c are operated in phase is assumed below.

At S3, the currents Ia, Ib and Ic flowing at the output of the inverter bridge 3 during operation of the island network are measured by the current measuring sensors 4a, 4b and 4c and are evaluated in the evaluation unit 51.

In an act which is initially optional for the method for determining the capacitance values of the capacitances of the PV system, a plausibility check is carried out at S4 using the current measurement values from S3 in order to identify defective current sensors 4. For example, greatly differing current measurement values Ia, Ib, Ic would indicate a defective current sensor rather than differences in the capacitances to be determined. A current value which is constantly zero also indicates a defective current sensor. When determining whether a current value Ia, Ib, Ic indicates a defective current sensor, current values from comparable measurements from the past, which have been stored for logging purposes, can also be used.

If a current sensor is identified as defective at S4 (NO), the method branches to S5 in which the presence of a defective current sensor 4 is signaled, for example by transmitting a corresponding message to a superordinate monitoring device via a signal and/or data line. The method is then terminated and the operation of the inverter is stopped.

If the current values Ia, Ib, Ic are at least in a range which appears to be plausible at S4 (YES), the method is continued at S6 in which the capacitance values are actually determined. Plausibility limits for the corresponding current values can be determined, in the case of an output current filter having inductances and capacitances (LC filter), and taking into account component tolerances and other tolerances, on the basis of the impedance of the output current filter, the measured currents and the measured or predefined voltages across the output current filter.

Figure 5A:
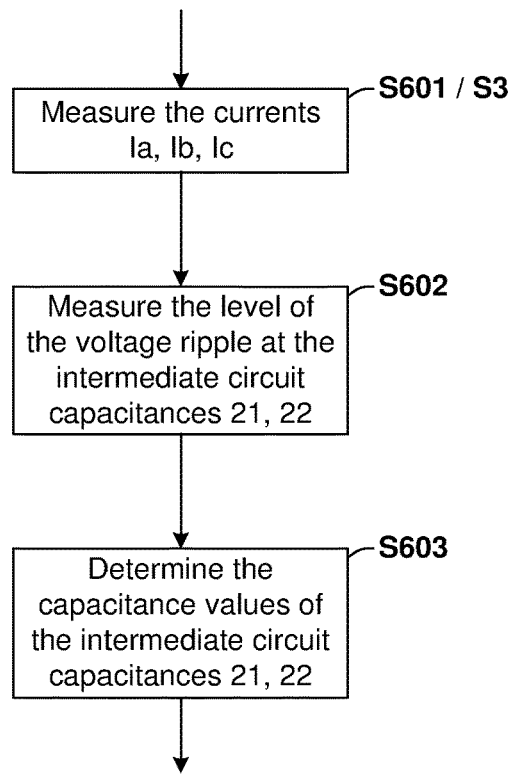
FIG. 5a shows a flowchart with method steps for determining intermediate circuit capacitances.
Figure 5B:
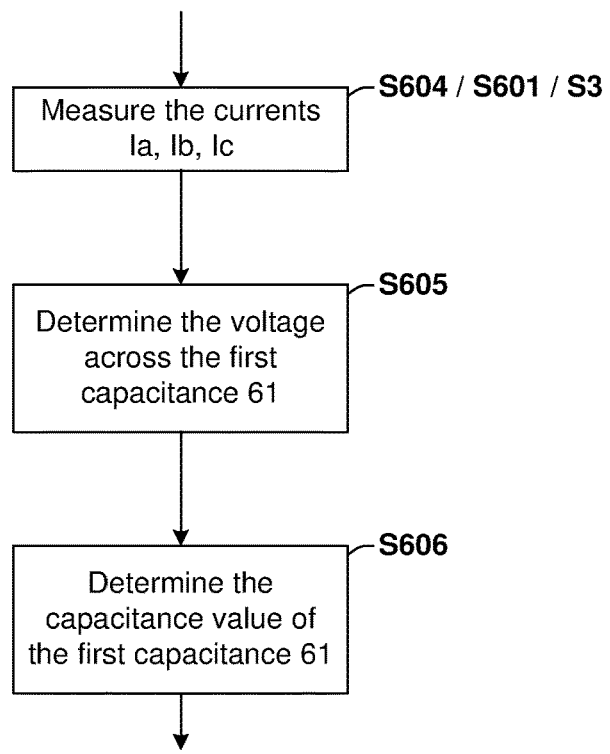
FIGS. 5b and 5c each show a flowchart with method steps for determining first or second capacitances of an output current filter.
Figure 5C:
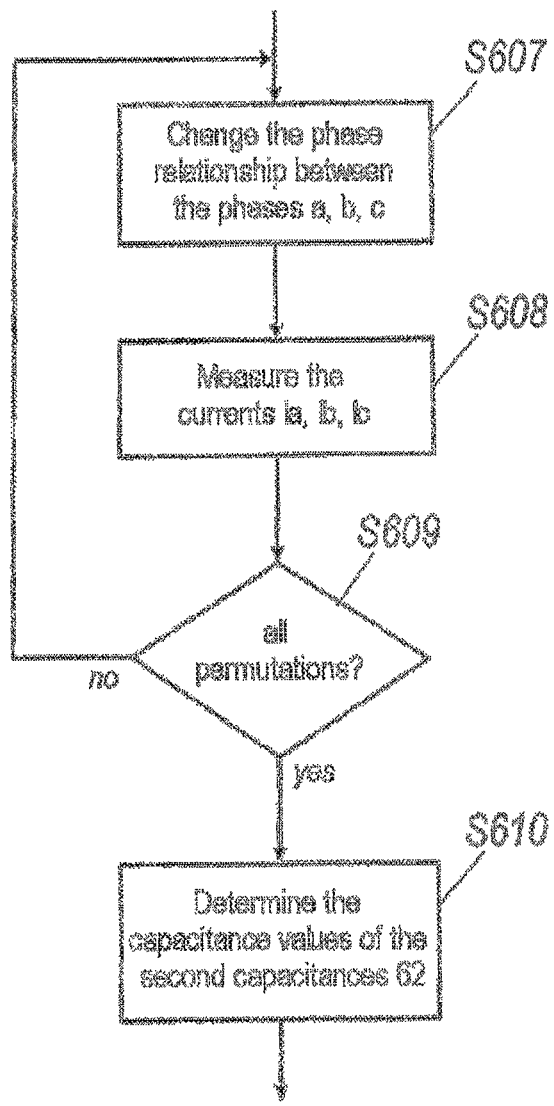

Details of act S6 are explained in more detail in further flowcharts in FIGS. 5a, 5b and 5c.

The result of the capacitance determination from act S6 is evaluated in a subsequent act S7. In this case, stored limit values are used to consider whether or not the capacitances are in a predefined tolerance range. In this case, absolute values of the capacitances can be considered, on the one hand, in particular limit values relative to nominal values of the capacitances, and rates of change of the capacitances can also be considered, on the other hand. In a similar manner to that described above in connection with the checking of the current sensors at S4, the determined capacitances are preferably also logged in a log memory, with the result that capacitance values determined in previous measurements can likewise be used to assess the currently measured capacitance values. The method described here for determining the capacitance values inside a PV system is preferably carried out regularly, for example during each starting process in the morning—and therefore at least once a day, with the result that it is possible to continuously observe the capacitance values.

If the capacitance values are not in a suitable tolerance range at S7 (NO), the method branches to S8 in which the corresponding capacitance or the capacitor on which the capacitance is based is signaled as defective, for example again by means of a corresponding message to the superordinate monitoring device via the signal and/or data line. Like at S5, the operation of the inverter 9 is then terminated.

If the capacitances have been identified as being within the tolerance range at S7 (YES), the method is continued at S9 in which the determined capacitance values are processed further. On the one hand, the capacitance values are logged in at S9, either inside the control device 5 or inside the superordinate monitoring device. On the other hand, the determined capacitance values can be used to optimize control and/or regulating parameters for the inverter 9 and therefore to optimally adjust the feed currents and prevent instabilities in the regulation.

An instantaneous rate of change of the capacitance values can be determined from the continuous observation of the capacitance values, for example the daily percentage or absolute change in the capacitance values. A severe change in the capacitance values indicates an imminent failure of the corresponding capacitor. FIG. 4 represents a typical time curve 71 of a capacitance C of a capacitor. The reduction in the capacitance C from a nominal capacitance Cnenn with advancing time t is illustrated. Capacitors typically lose their capacitance very slowly at first with low rates of change over a long period before the rate of change quickly increases and the capacitance falls quickly from a particular time which is depicted here by way of example as a dashed line at $t=t^*$.

If, on the basis of the rates of change of the capacitance values, failure of one of the capacitors is imminent, a corresponding service message for preventive maintenance or for replacing the corresponding capacitor can be output at S10 which is likewise optional.

Finally, the starting process of the inverter 9 can be continued at S11 and the inverter 9 can be connected to the energy supply network 8 with the parameters for the feed mode which have been optimized at S9.

FIGS. 5a-5c show details of the determination of the capacitance values during method step S6 from FIG. 3 in three flowcharts. The flowchart in FIG. 5a describes method acts for determining the capacitance of the intermediate circuit capacitors 21, 22. The flowchart in FIG. 5b describes method acts for determining the capacitance values of the first capacitances 61 of the output current filter 6. The method illustrated in FIG. 5c represents the method steps for determining the capacitance values of the second capacitances 62 of the output current filter 6.

The methods illustrated in FIGS. 5a and 5b can be carried out independently of one another. The method shown in FIG. 5c presupposes the previous performance of the method from FIG. 5b. In one configuration of the method according to FIG. 3, the method acts shown in all partial FIGS. 5a to 5c are carried out in succession at S6 in order to advantageously obtain information relating to all relevant capacitances of the PV system, that is to say the intermediate circuit capacitances 21, 31, the first capacitances 61 and the second capacitances 62 of the output current filter 6.

In a first act S601 in FIG. 5a, the current measurement from S3 is either carried out again or the current values measured at S3 are adopted for further evaluation. The current measurement at S601 is therefore carried out in the same manner as the current measurement S3 in an operating state of the inverter in which voltage is applied to all three phases a, b, c in phase without a phase shift with respect to one another during island network operation by the inverter bridge 3. On account of all phases a, b, c being in phase, currents do not flow through the inductances 63 or through the capacitances 62 when the AC switching element 7 is open. As is shown in the equivalent circuit diagram of the output current filter 6 in FIG. 2b, these components can accordingly be ignored for this operating state of the inverter 9. In electrical terms, only the capacitance 61 is relevant in this operating state and should be taken into account.

The three first capacitances 61a, 61b, 61c of the three phases are therefore connected in parallel as it were and their charges are reversed at the output current frequency of the currents Ia, Ib, Ic, that is to say usually at 50 Hz or 60 Hz. Charge is therefore permanently transferred back-and-forth between the first capacitances 61 and the intermediate circuit capacitances 21, 22 by switching the semiconductor switches 31, 32, in which case the magnitude of the current transmitting the charge was measured at S601 or S3. The charge transfer results in the intermediate circuit capacitances 21, 22 permanently being charged and discharged, which is shown in a variation in the voltages applied to these capacitances 21, 22. The variation in the voltage across the intermediate circuit capacitances 21, 22 is also referred to as voltage ripple. The voltage ripple could also be observed if the phases a, b, c were not operated in phase; for example, if all three phases were each operated with a phase shift of 120° with respect to one another, the intensity of the voltage ripple would then be considerably smaller, however, and therefore more difficult to measure. This applies, in particular, since the voltage in the intermediate circuit may be some 100 volts, whereas the voltage ripple at the charge reversal currents occurring in this island network situation is in the range of at most a few volts or else less than one volt. Operating the phases a, b, c in phase results in the greatest possible voltage ripple which can be observed for these charge reversal currents and is therefore advantageous for the measurement accuracy.

The capacitance value of the intermediate circuit capacitances 21, 22, which can be substantially attributed to the intermediate circuit capacitors used, can be determined from the level of the measured voltage ripple in conjunction with the measured currents Ia, Ib, Ic.

In this case, the following relationship between the capacitance values $C_{21}$ and $C_{22}$ of the intermediate circuit capacitances 21 and 22, a measured amplitude $\hat{U}_{21}$ and $\hat{U}_{22}$ of the respective voltage ripple at the intermediate circuit capacitances 21 and 22, and the amplitude $\hat{I}$ of the sum of the measured currents Ia, Ib, and Ic can be used as a basis: $C_{21}=\hat{I}/(\omega\hat{U}_{21})$ and accordingly $C_{22}=\hat{I}/(\omega\hat{U}_{22})$, where $\omega$ indicates the angular frequency of the alternating current Ia, Ib, Ic. Only one of the relationships accordingly needs to be taken into account for an intermediate circuit having only one intermediate circuit capacitance.

The method illustrated in FIG. 5b for determining the capacitance values of the first capacitances 61 of the output current filter 6 can be carried out after the method shown in FIG. 5a. However, it is also possible to carry out the method illustrated in FIG. 5b without the method illustrated in FIG. 5a having been carried out beforehand.

At S604, the currents Ia, Ib, Ic flowing at the in-phase outputs of the inverter bridge 3 are again measured. If the method shown in FIG. 5a was carried out beforehand, the measured values at S601 can be adopted. Furthermore, it is also possible here to use the measured values from act S3.

At S605, the level of the voltage, to which the first capacitances 61 are charged, is determined. This voltage can either be measured or can be gathered from specifications since the inverter 9 usually adjusts the level of the output AC voltage at the output of the inverter bridge 3 to this predefined voltage value during island operation by virtue of the semiconductor switches 31, 32 suitably modulating the voltage applied to the intermediate circuit capacitances 21, 22. At S606 which then follows, the capacitance values of the first capacitances 61 are determined using the corresponding pairs of values of current Ia, Ib, Ic and the voltage applied to the capacitances 61, 62.

In the flowchart in FIG. 3, the checking of the capacitances at S7 follows the determination of the capacitance values at S6. It goes without saying that a query regarding whether a determined capacitance value is in the tolerance range can already be carried out after each of the partial methods in FIGS. 5a and 5b.

FIG. 6a again illustrates the operating situation of the inverter in the PV system, on which the methods in FIGS. 5a and 5b are based, in another manner. In this schematic drawing, the inverter is represented by the equivalent circuit diagram of a voltage source 10. The in-phase nature of the phases a, b, c is expressed in the presence of only one voltage source 10 to which all phases are connected in a parallel manner.

After the capacitance values of the first capacitances 61 of the output current filter 6 have been determined, the method illustrated in FIG. 5c is carried out in order to determine the second capacitances 62 of the output current filter 6.

At S607 of this method, the control of the semiconductors 31, 32 of the inverter bridge 3 is modified in such a manner that a changed phase relationship between the phases a, b, c is produced. An island network is still retained in this case. Specifically, when act S607 is first carried out, the in-phase nature is retained for two of the phases a, b, c, whereas the third of the phases is operated in contrast with a phase shift of 180 degrees with respect to the voltage.

Figure 6A:
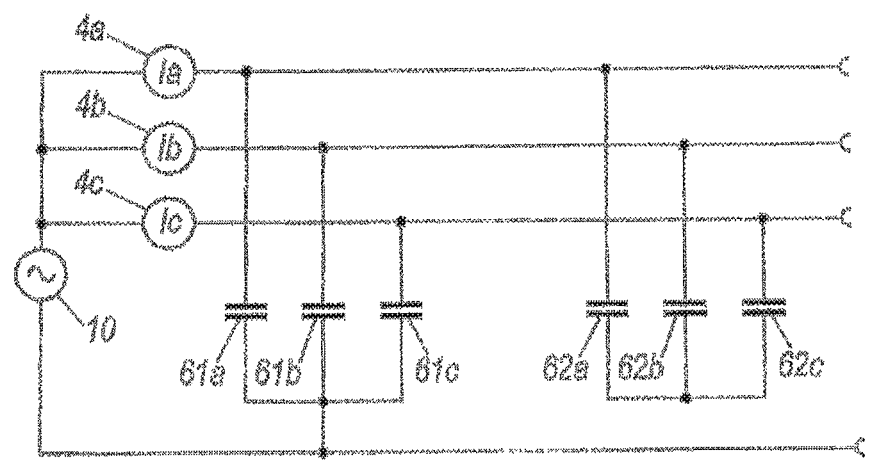
Figure 6B:
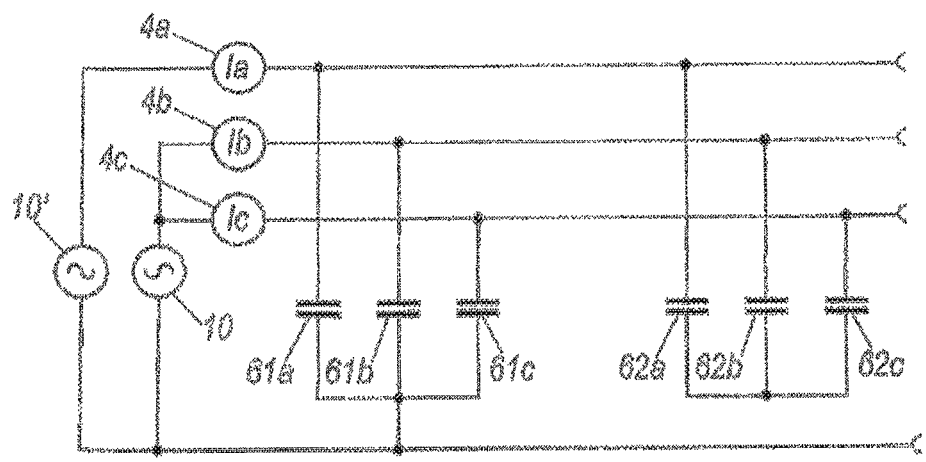

This situation is illustrated in the equivalent circuit diagram in FIG. 6b in a similar manner to the equivalent circuit diagram in FIG. 6a. By way of example, the phases b and c are operated in phase here by virtue of them being connected to the voltage source 10. In contrast, a voltage source 10' operated with a reverse polarity applies a phase shift in the voltage of 180 degrees to the phase a. After this operating state has been established, the currents Ia, Ib, Ic are again measured in a subsequent act S608.

At S609, the method branches back to S607 in which the phase relationship of the phases a, b, c with respect to one another is now changed in such a manner that a different one of the phases is now operated in an opposing manner with respect to two phases in the same direction. This situation is represented in the equivalent circuit diagram in FIG. 6c in which the phases a and c are operated together, that is to say in phase, from the first voltage source 10 and the phase b is operated with a phase shift of 180 degrees from the voltage source 10'. Act S608 in which the currents Ia, Ib, Ic are measured and stored is run through again. Each time act S609 is run through again, it is queried whether all possible permutations of the phase relationships have now been checked. If this is not the case, the method branches back to S607 again in order to set the now last of the permutations which is represented in the equivalent circuit diagram in FIG. 6d. With this combination, the phases a and b are operated in phase from the voltage source 10 and the phase c is operated in an opposing manner from the voltage source 10'. The currents Ia, Ib, Ic are measured again at S608 and the method is then continued at S610.

Figure 6C:
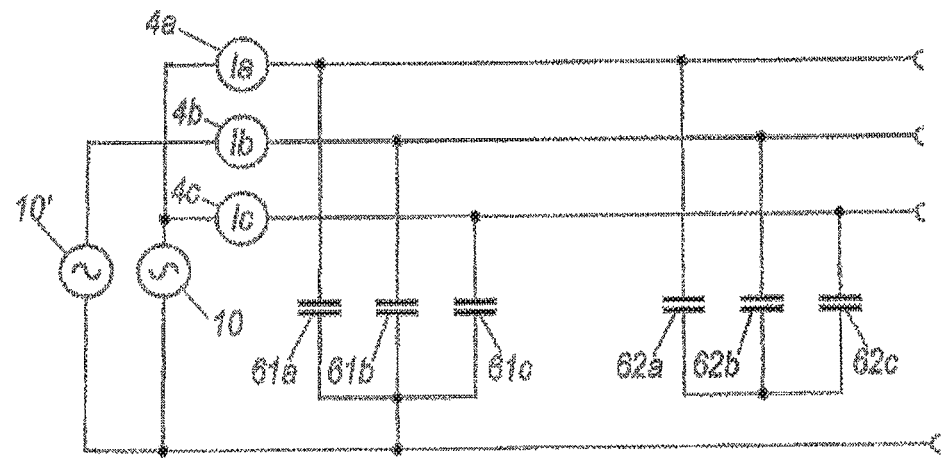
Figure 6D:
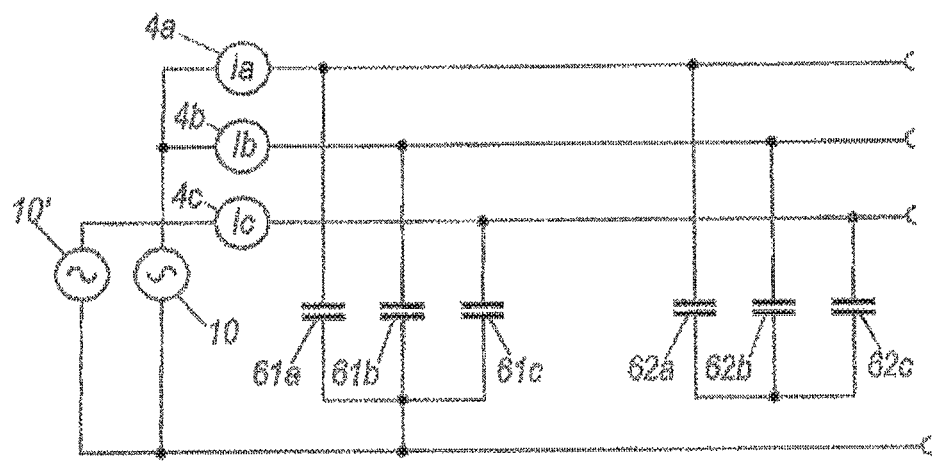

On account of the phase shift of in each case one of the phases with respect to the other two phases, the assumption made in FIGS. 5a and 5b, that no currents flow through the two capacitances 62, no longer applies to the operating situations illustrated in FIGS. 6b to 6d. Rather, a displacement current is established here as a result of charge reversal between the first capacitances 61 and the second capacitances 62 in various combinations. The currents which are established can be related to the capacitance values. The result is a system of equations which can be solved according to capacitance values of the capacitances 62 if both the first capacitances 61 and the currents Ia, Ib, Ic in the individual operating situations are known. The solution of the system of equations at S610 then results in the determination of the second capacitances 62.

If all three possible permutations are set and measured in acts S607 and S608 in the method illustrated, the system of equations is over-determined for the three second capacitances 62. The over-determined nature makes it possible to estimate the quality and therefore the significance of the measurement result. In principle, the measurement of two permutations would suffice in acts S607 and S608 to be able to determine the capacitance values of the three capacitances 62.

During the evaluation at S610, the inductances 63 are disregarded since, when carrying out the measurements at the network frequency, they are usually dimensioned in such a manner that they do not have an influence or have only a negligible influence on the measured values. In principle, however, it is possible to additionally carry out the measurements carried out at S6 in FIG. 3 at a higher frequency at which the influence of the inductances 63 can no longer be ignored. A comparison of the results of the measurements at higher frequency with those of the measurements at the network frequency then additionally makes it possible to determine the magnitudes of the inductances 63. It is also noted that further inductances may be provided in the output current filter 6, for example between the output of the inverter bridge and the connection of the first inductances 61. These inductances are also initially insignificant, but could be determined if the method illustrated in FIG. 5b for determining the capacitance values of the first capacitances 61 is carried out at different frequencies.

In an alternative configuration of the method, provision may be made for the measurements at S6 according to FIG. 3 to be carried out repeatedly, in particular if the capacitance values determined are outside an expected range. This is advantageous for determining the capacitance values of the intermediate circuit capacitances 21, 22 according to FIG. 5a. Electrolytic capacitors are often used to provide the intermediate circuit capacitances 21, 22 since they are relatively cost-effective and provide a large capacitance based on their volume and their weight. At very low temperatures below the freezing point, electrolytic capacitors may drastically lose capacitance on account of a physical state change of the electrolyte ("freezing" of the electrolyte). It is not only scarcely possible to operate the PV system in such a state, since the regulating characteristics of the inverter are not set to such small capacitance values, but is also dangerous since the high pulse current loading in the frozen state could destroy the electrolytic capacitors.

However, the continuous charge displacement which takes place during the measurement method in FIG. 5a between the intermediate circuit capacitances 21, 22 and the capacitances 61 of the output current filter 6 deposits a power loss in the form of heat in the intermediate circuit capacitors 21, 22. If this operating state of the inverter 9 is maintained over a relatively long time, the intermediate circuit capacitors 21, 22 may heat up slowly and in a controlled manner as a result and therefore again reach their original capacitance value. If the method shown in FIG. 5a is therefore carried out repeatedly and, in particular, virtually continuously, a change in the measured capacitance of the capacitances 21, 22 can be observed at S603.

Figure 7A:
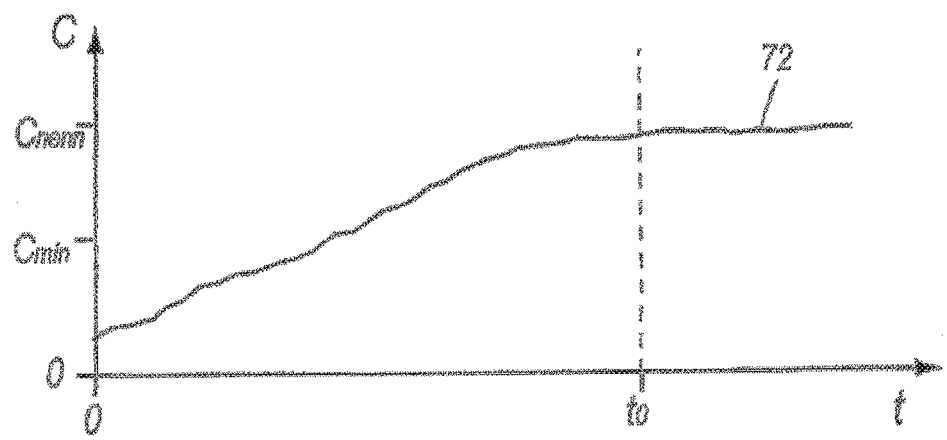

This is illustrated for two different situations in two partial images a, b in FIG. 7. The graphs each illustrate a time curve 72 and 73 of a capacitance value C with advancing time t. The measured capacitance value C of one of the intermediate circuit capacitances 21, 22 is illustrated on the vertical axis and the time t is illustrated on the horizontal axis.

At the time t=0 at which a first measurement was carried out according to FIG. 5a, the capacitance C of the intermediate circuit capacitor 21, 22 is considerably below a minimum capacitance Cmin needed to operate the PV system. The measured capacitance C increases continuously with increasing time t, exceeds the necessary minimum value Cmin and asymptotically approaches the nominal capacitance value Cnenn. If such a behavior is observed while continuously determining the capacitance according to FIG. 5a, a "frozen" intermediate circuit capacitance 21, 22 can be inferred, the temperature of the corresponding capacitors in the intermediate circuit 2 being increased during the measurement method to such an extent that a feed mode of the PV system can then be carried out.

Figure 7B:
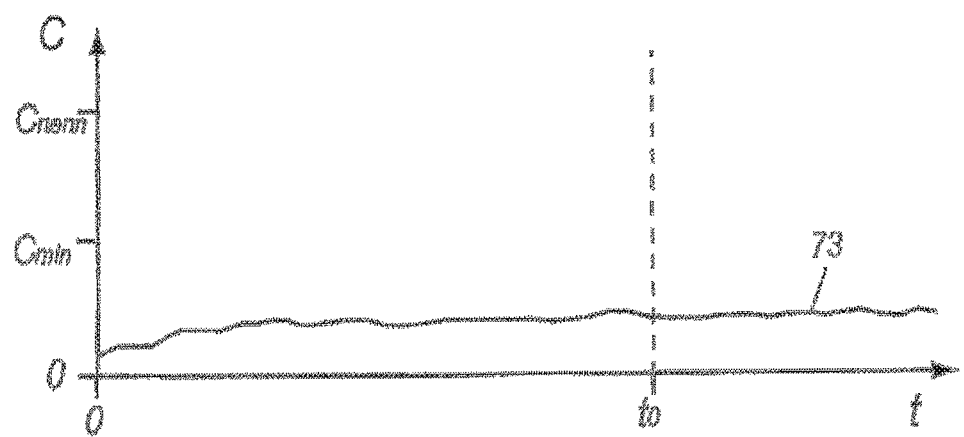

In the example illustrated in FIG. 7b, a comparably small capacitance C is measured for the intermediate circuit capacitances 21 and 22 during a first run of the measurement method at the time t=0. Even after a relatively long run time of the measurement method, this capacitance C does not significantly change and remains below the minimum capacitance Cmin needed to operate the PV system. After expiry of a predefined period which stipulates a maximum measuring time, it can be inferred in case b that the observed low capacitance for the intermediate circuit capacitances 21, 22 can be attributed to a defect in one or more of the capacitors used and not to freezing. Accordingly, a defect message would be output according to act S8 from FIG. 3 and the starting process of the inverter 9 would be aborted.

The invention claimed is:

1. A method for determining capacitance values of capacitances of a photovoltaic system comprising a multiphase inverter which comprises an output current filter on an alternating current side thereof and is connected to a multiphase energy supply network via a switching element and is associated with at least one intermediate circuit capacitance on a direct current side thereof, comprising:
   disconnecting the photovoltaic system from the energy supply network by opening the switching element;
   operating the inverter to set up an island network after the disconnecting, wherein an in-phase AC voltage is applied to at least two outputs of an inverter bridge of the multiphase inverter and a flow of current is produced between the at least one intermediate circuit capacitance and at least one filter capacitance of the output current filter;
   measuring currents (Ia, Ib, Ic) flowing at the outputs of the inverter bridge and at least one voltage present at one of the capacitances, and
   determining a capacitance value of at least one of the capacitances using the determined voltage and the measured currents (Ia, Ib, Ic).

2. The method as claimed in claim 1, further comprising measuring the voltage across the at least one intermediate circuit capacitance of the photovoltaic system, and determining the capacitance value of the at least one intermediate circuit capacitance from a level of a ripple in the measured voltage and the measured currents (Ia, Ib, Ic).

3. The method as claimed in claim 1, further comprising determining a voltage across at least one first capacitance of the output current filter, and determining the capacitance value of the at least one first capacitance from the determined first capacitance voltage and the measured currents (Ia, Ib, Ic).

4. The method as claimed in claim 1, further comprising applying the AC voltage in phase to all outputs of the inverter bridge of the inverter.

5. The method as claimed in claim 1, further comprising determining a voltage across at least one second capacitance of the output current filter, and determining a capacitance value of the at least one second capacitance using at least two measurements of voltages and currents (Ia, Ib, Ic), the at least two measurements being carried out with different phase relationships of the AC voltages at the outputs of the inverter bridge.

6. The method as claimed in claim 5 carried out in a three-phase inverter, wherein an in-phase AC voltage respectively is applied to two outputs of the inverter bridge in each of the at least two measurements and an AC voltage which differs therefrom in terms of its phase angle being applied to a third output of the inverter bridge.

7. The method as claimed in claim 6, wherein the AC voltage applied to the third output has a phase angle of 180 degrees with respect to the AC voltage applied to the other two outputs of the inverter bridge.

8. The method as claimed in claim 5, in which three measurements are carried out, the AC voltage which differs in terms of its phase angle being applied to a different one of the outputs of the inverter bridge in each of the measurements.

9. The method as claimed in claim 1, further comprising comparing the determined capacitance value with a predefined minimum capacitance value (Cmin), and providing a signaling if the determined capacitance value is below the minimum capacitance value (Cmin).

10. The method as claimed in claim 1, further comprising storing the determined capacitance value and comparing the determined capacitance value with previously stored capacitance values.

11. The method as claimed in claim 10, further comprising determining a rate of change of the capacitance value from the determined capacitance value (C) and at least one stored capacitance value, and estimating a service life of a capacitor providing the capacitance using the rate of change.

12. The method as claimed in claim 1, wherein the method is performed repeatedly during a starting process of the inverter.

13. The method as claimed in claim 12, wherein the method is performed for heating capacitors in the intermediate circuit if the determined intermediate circuit capacitance changes.

14. The method as claimed in claim 1, wherein the method is performed for different frequencies of the AC voltage at the outputs of the inverter bridge in order to determine an inductance value of at least one inductance of the output current filter.

15. A multiphase inverter for connection to an energy supply network, comprising a control device with an evaluation unit, the multiphase inverter comprising an output current filter on an alternating current side thereof that is connected to the energy supply network via a switching element and at least one intermediate circuit capacitance on a direct current side thereof, wherein the control device, in conjunction with the evaluation unit, is configured to:
- disconnect the photovoltaic system from the energy supply network by opening the switching element;
- operate the inverter to set up an island network after the disconnecting, wherein an in-phase AC voltage is applied to at least two outputs of an inverter bridge of the multiphase inverter and a flow of current is produced between the at least one intermediate circuit capacitance and at least one filter capacitance of the output current filter;
- measure currents (Ia, Ib, Ic) flowing at the outputs of the inverter bridge and at least one voltage present at one of the capacitances, and
- determine a capacitance value of at least one of the capacitances using the determined voltage and the measured currents (Ia, Ib, Ic).

* * * * *